US011127676B2

(12) United States Patent
Park et al.

(10) Patent No.: US 11,127,676 B2
(45) Date of Patent: Sep. 21, 2021

(54) REMOVAL OR REDUCTION OF CHAMFER FOR FULLY-ALIGNED VIA

(71) Applicant: International Business Machines Corporation, Armonk, NY (US)

(72) Inventors: Chanro Park, Clifton Park, NY (US); Koichi Motoyama, Clifton Park, NY (US); Kenneth Chun Kuen Cheng, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/745,076

(22) Filed: Jan. 16, 2020

(65) Prior Publication Data

US 2021/0225759 A1    Jul. 22, 2021

(51) Int. Cl.
*H01L 23/522* (2006.01)
*H01L 21/768* (2006.01)
*H01L 21/311* (2006.01)
*H01L 23/528* (2006.01)

(52) U.S. Cl.
CPC .... *H01L 23/5226* (2013.01); *H01L 21/31111* (2013.01); *H01L 21/31144* (2013.01); *H01L 21/76802* (2013.01); *H01L 21/76834* (2013.01); *H01L 21/76846* (2013.01); *H01L 21/76877* (2013.01); *H01L 23/5283* (2013.01)

(58) Field of Classification Search
CPC ........... H01L 23/5226; H01L 21/76802; H01L 23/5283; H01L 21/76834; H01L 21/76846; H01L 21/76877; H01L 21/31111; H01L 21/31144

See application file for complete search history.

(56) References Cited

U.S. PATENT DOCUMENTS

| | | |
|---|---|---|
| RE36,644 E | 4/2000 | Dennison |
| 6,287,961 B1 | 9/2001 | Liu et al. |
| 6,603,206 B2 | 8/2003 | Wang et al. |
| 6,821,879 B2 * | 11/2004 | Wong ............... H01L 21/76843 438/597 |
| 7,026,714 B2 | 4/2006 | Cunningham |
| 7,354,856 B2 | 4/2008 | Yeh et al. |
| 7,635,884 B2 | 12/2009 | Gaidis et al. |

(Continued)

OTHER PUBLICATIONS

K. Motoyama et al., "Discrete Study of ALD TaN on Via and Line for Low Resistive and High Reliable Cu/Low-k Interconnects and Other Applications," ECS Journal of Solid State Science and Technology, Oct. 10, 2012, pp. P303-P309, vol. 1, No. 6.

*Primary Examiner* — Karen Kusumakar
(74) *Attorney, Agent, or Firm* — L. Jeffrey Kelly; Ryan, Mason & Lewis, LLP

(57) ABSTRACT

A method for manufacturing a semiconductor device includes forming a first interconnect in a first dielectric layer, and forming a second dielectric layer on the first dielectric layer. In the method, an etch stop layer is formed on the second dielectric layer, and a third dielectric layer is formed on the etch stop layer. The method also includes forming a trench in the third dielectric layer, wherein a bottom surface of the trench includes the etch stop layer. A second interconnect is formed in the trench on the etch stop layer, and a via is formed in the second dielectric layer. The via connects the second interconnect to the first interconnect.

20 Claims, 16 Drawing Sheets

(56) References Cited

U.S. PATENT DOCUMENTS

| | | |
|---|---|---|
| 9,059,257 B2 | 6/2015 | Li et al. |
| 9,659,864 B2 | 5/2017 | Wu et al. |
| 9,911,690 B2 | 3/2018 | Edelstein et al. |
| 10,032,643 B2 | 7/2018 | Chawla et al. |
| 2003/0190829 A1* | 10/2003 | Brennan ............. H01L 23/5226 439/200 |
| 2015/0162280 A1* | 6/2015 | Pan ..................... H01L 21/0337 257/774 |
| 2020/0058548 A1* | 2/2020 | Han ................... H01L 21/76816 |
| 2020/0075478 A1* | 3/2020 | Kim .................... H01L 23/5283 |
| 2020/0411435 A1* | 12/2020 | Liu .................... H01L 21/76877 |

* cited by examiner

100

100

100

300

REMOVAL OR REDUCTION OF CHAMFER FOR FULLY-ALIGNED VIA

BACKGROUND

A chamfered via includes an angled or sloped edge (e.g., chamfer) extending from a top to a bottom of the via. The chamfer can be angled such that the width of the via narrows in a direction from a top to a bottom of the via. When a via is chamfered and not aligned with an underlying conductive line (e.g., interconnect), there is an increased risk of shorting between the via and a line adjacent to the underlying conductive line.

A via which is fully aligned with an underlying conductive line has been proposed to mitigate the shorting risk. However, reactive ion etching (RIE) lag when forming via openings results in deep trenches and large chamfers, as well as loss of selectivity to a guiding topography cap, which still results in shorting between the via and adjacent lines even when using a fully-aligned via (FAV) scheme.

SUMMARY

According to an exemplary embodiment of the present invention, a method for manufacturing a semiconductor device includes forming a first interconnect in a first dielectric layer, and forming a second dielectric layer on the first dielectric layer. In the method, an etch stop layer is formed on the second dielectric layer, and a third dielectric layer is formed on the etch stop layer. The method also includes forming a trench in the third dielectric layer, wherein a bottom surface of the trench includes the etch stop layer. A second interconnect is formed in the trench on the etch stop layer, and a via is formed in the second dielectric layer. The via connects the second interconnect to the first interconnect.

According to an exemplary embodiment of the present invention, a semiconductor device includes a first interconnect disposed in a first dielectric layer, a second dielectric layer disposed on the first dielectric layer, and a third dielectric layer disposed on the second dielectric layer. A second interconnect is disposed in a trench in the third dielectric layer. A bottom surface of the trench includes an etch stop layer, which is disposed directly on the second dielectric layer. The semiconductor device also includes a via disposed in the second dielectric layer. The via connects the second interconnect to the first interconnect.

According to an exemplary embodiment of the present invention, a method for manufacturing a semiconductor device includes forming an etch stop layer on a first dielectric layer, and forming a second dielectric layer on the etch stop layer. In the method, a trench is formed in the second dielectric layer, wherein a bottom surface of the trench includes the etch stop layer. The method also includes forming an interconnect in the trench on the etch stop layer, and forming a via in the first dielectric layer. The via is connected to the interconnect.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
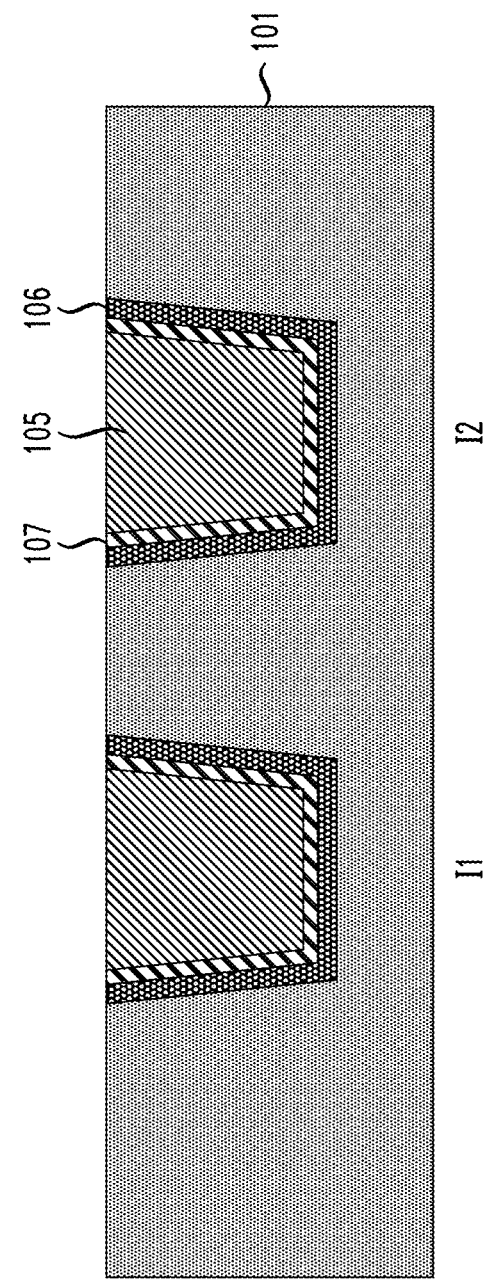
FIG. 1 is a cross-sectional view illustrating fabrication of a semiconductor device, and showing formation of a lower level metallization layer, according to an exemplary embodiment of the present invention.

Exemplary embodiments of the invention will now be discussed in further detail with regard to semiconductor devices and methods of manufacturing same and, in particular, to a FAV without chamfers or minimal chamfered edges.

It is to be understood that the various layers and/or regions shown in the accompanying drawings are not drawn to scale, and that one or more layers and/or regions of a type commonly used in, for example, complementary metal-oxide semiconductor (CMOS), fin field-effect transistor (FinFET), metal-oxide-semiconductor field-effect transistor (MOSFET), programmable logic devices (PLDs), programmable gate arrays, programmable read-only memory (PROM) devices, including, but not limited to, erasable programmable read-only memories (EPROMS), electronically erasable programmable read-only memories (EEPROMS), and/or other semiconductor devices in which anti-fuses may be used, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs, FinFETs, PLDs, programmable gate arrays, PROMS, EPROMS, and/or EEPROMS. By way of non-limiting example, the semiconductor devices can include, but are not necessarily limited to CMOS, MOSFET, FinFET, PLD, programmable gate array, PROM, EPROM, and/or EEPROM devices, and/or semiconductor devices that use CMOS, MOSFET, FinFET, PLD, programmable gate array, PROM, EPROM, and/or EEPROM technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surfaces of the dielectric layers in the cross-sectional views, and "horizontal" refers to a direction parallel to the top surfaces of the dielectric layers in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

There is a need for via and metallization layer structures and methods of manufacturing same which prevent shorting between vias and metallization layer lines. In accordance with the embodiments, an etch stop layer is used during manufacturing to form trenches with uniform depths and a reliable FAV and metal wire structure that eliminates or reduces chamfers.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

Referring to FIG. 1, a semiconductor device 100 includes interconnects I1 and I2 formed in a first dielectric layer 101. The interconnects I1 and I2 each include a barrier layer 106 and liner layer 107 formed on the barrier layer 106. A fill layer 105 is formed on the liner layer 107. The barrier layer 106 includes, for example, titanium nitride, tantalum nitride or tungsten nitride and is conformally formed on sidewalls and a bottom surface of a trench in the first dielectric layer 101. The liner layer 107 includes, for example, cobalt and/or ruthenium and is conformally formed on the barrier layer 106. The fill layer 105 includes, an electrically conductive metal, such as, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The interconnects I1 and I2 and the first dielectric layer 101 can form at least part of a lower metallization level ($M_x$).

Interconnects, also referred to herein as wires or conductive lines, function as conductive contacts. Interconnects form electrical connections between elements and/or devices, or form contacts to elements or devices. As used herein, an "interconnect" or "interconnect structure" includes a conductive fill layer, and may further include a barrier layer and/or a liner layer.

The first dielectric layer 101 includes, for example, silicon dioxide ($SiO_2$), carbon-doped silicon oxide (SiCOH), SiLK® dielectrics, porous forms of these low-k dielectric films, flowable dielectrics and/or spin-on dielectrics. As can be understood by one of ordinary skill in the art, the dielectric layer 101 can be on a semiconductor substrate (not shown), with intervening layers (e.g., lower conductive lines, devices, etc.) between the dielectric layer 101 and the substrate. A semiconductor substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors.

Figure 2:
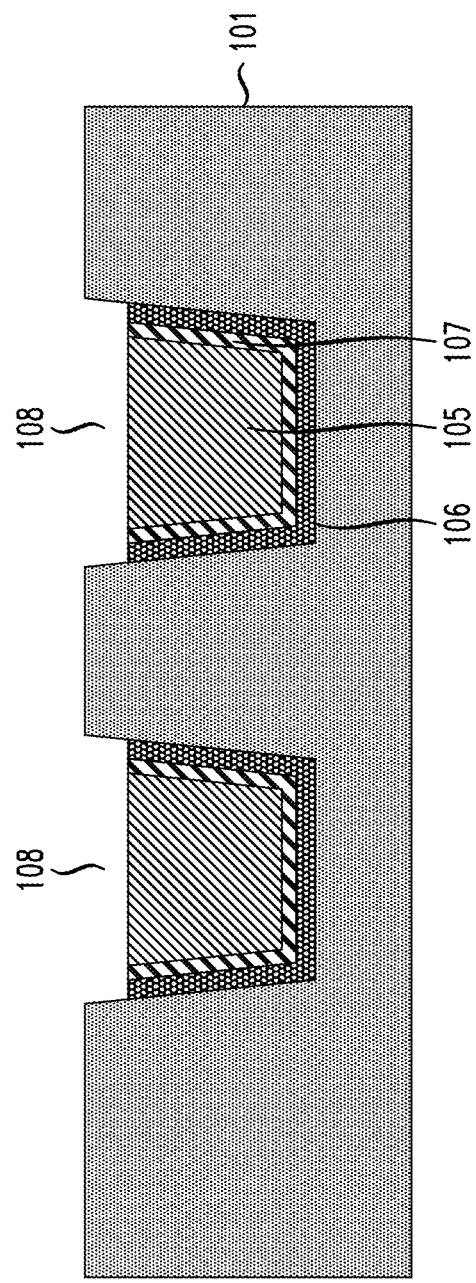
FIG. 2 is a cross-sectional view illustrating fabrication of a semiconductor device, and showing recessing of interconnect structures, according to an exemplary embodiment of the present invention.

Referring to FIG. 2, the interconnect structures I1 and I2 including the fill, barrier and liner layers 105, 106 and 107 are recessed such that the top surfaces of the fill, barrier and liner layers 105, 106 and 107 are at a height that is below the top surface of the dielectric layer 101. The recessing forms vacant areas 108 and is performed using, for example, a wet etch process to remove upper portions of the fill, barrier and liner layers 105, 106 and 107.

Figure 3:
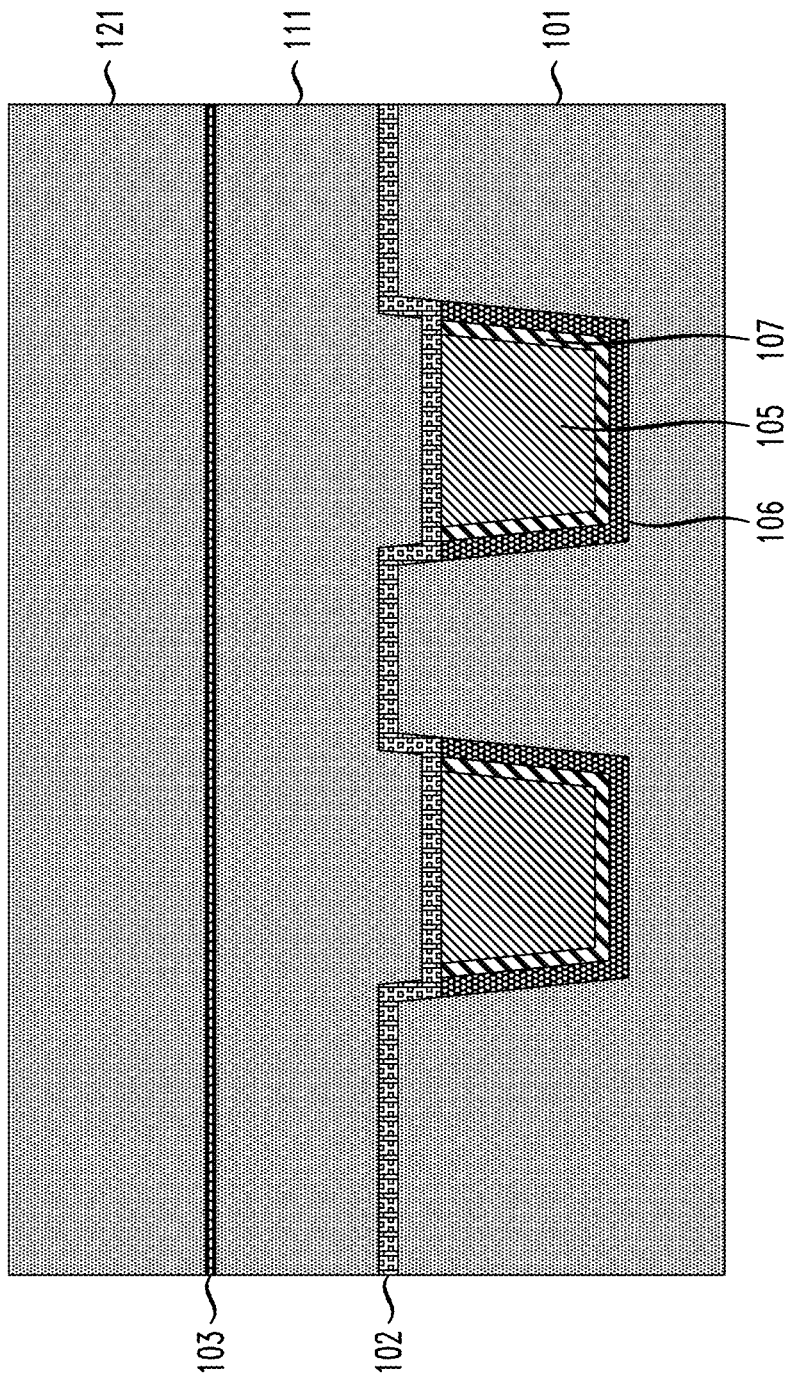
FIG. 3 is a cross-sectional view illustrating fabrication of a semiconductor device, and showing cap layer, dielectric layer and etch stop layer formation, according to an exemplary embodiment of the present invention.

Referring to FIG. 3, a dielectric capping layer 102 comprising, for example, NBLoK™ material or a nitride material (e.g., silicon carbonitride (SiCN)), is formed on the first dielectric layer 101. NBLoK™ material is from Applied Materials, Inc. of Santa Clara, Calif., and is a nitrogen-doped silicon carbide. As can be seen, the capping layer 102 is conformally deposited on a top surface of the dielectric layer 101, and on the interconnects I1 and I2 and side surfaces of the dielectric layer 101 in the vacant areas 108.

A second dielectric layer 111 is formed on the dielectric capping layer 102, and comprises, for example, the same material as or a similar material to the first dielectric layer 101. As can be seen, the second dielectric layer 111 fills in the vacant areas 108. The second dielectric layer 111 is deposited using one or more deposition techniques, such as, but not necessarily limited to, physical vapor deposition (PVD), chemical vapor deposition (CVD), atomic layer deposition (ALD), plasma-enhanced CVD (PECVD), radio frequency CVD (RFCVD), molecular layer deposition (MLD), molecular beam deposition (MBD), liquid source misted chemical deposition (LSMCD) and/or sputtering.

An etch stop layer 103 is deposited on the second dielectric layer 111. The etch stop layer 103 includes for example, an electrically conductive metal material such as, but not necessarily limited to, tantalum (Ta), tantalum nitride (TaN), Ta/TaN, Ta/Ruthenium (Ru), Ta/Cobalt (Co), TaN/Ru, TaN/Co, Ta/TaN/Ru, and/or Ta/TaN/Co. The etch stop layer 103 can also be a dielectric material, such as, but not necessarily limited to, silicon nitride (SiN) or silicon carbon nitride (SiCN). The etch stop layer 103 is deposited using deposition techniques such as, but not necessarily limited to, PVD, CVD, ALD, PECVD, RFCVD, MLD, MBD, LSMCD, and/or sputtering.

A third dielectric layer 121 is deposited on the etch stop layer 103. According to an embodiment, the third dielectric layer 121 comprises the same or similar material as that of the first and second dielectric layers 101 and 111, as long as the third dielectric layer 121 is able to be selectively etched with respect to the etch stop layer 103. The third dielectric layer 121 is deposited using, for example, PVD, CVD, ALD, PECVD, RFCVD, MLD, MBD, LSMCD, and/or sputtering. The etch stop layer 103 permits complete removal of the third dielectric layer 121 down to the etch stop layer 103, which helps reduce or prevent chamfering, thereby reducing the chances of shorting neighboring metal lines in a lower metallization level ($M_x$).

Figure 4:
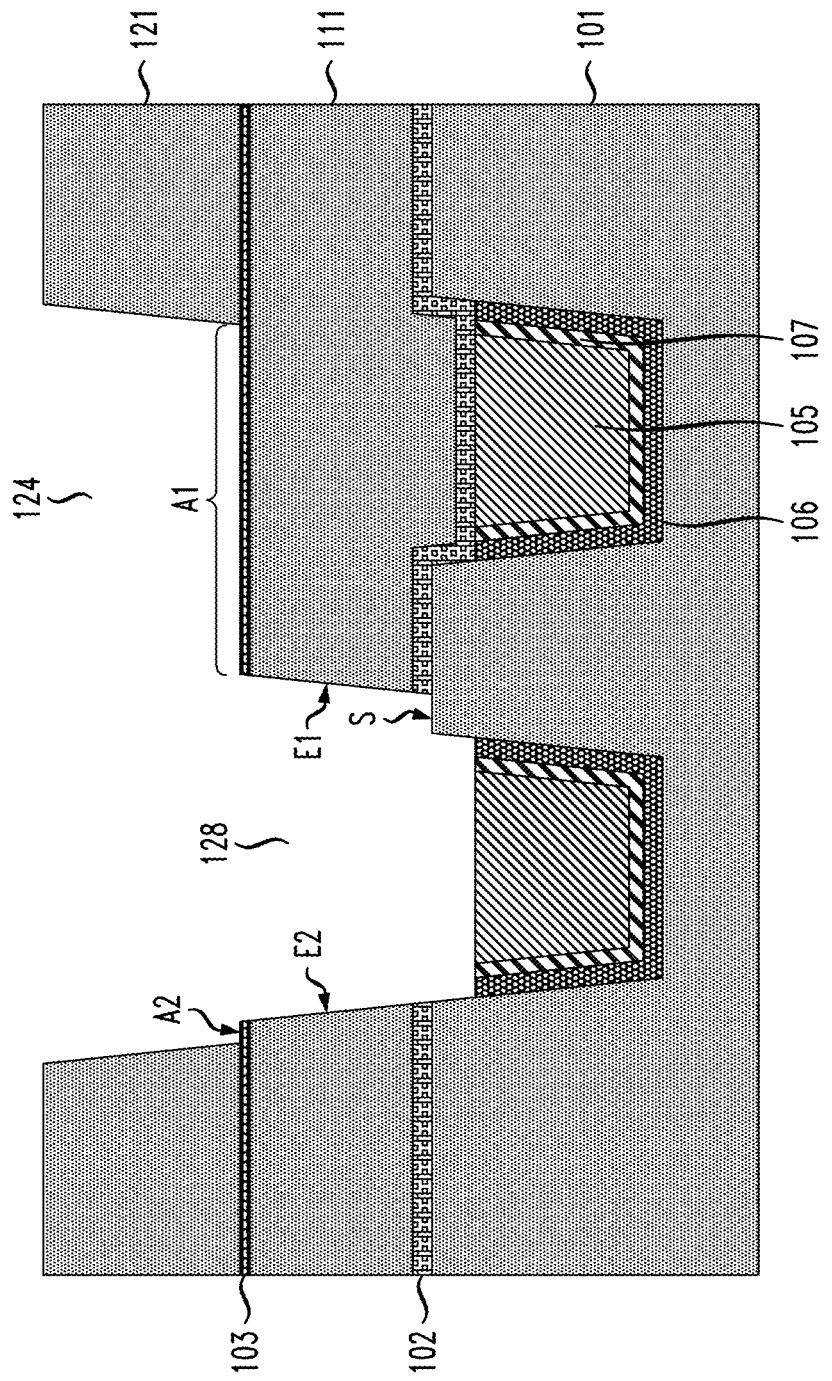
FIG. 4 is a cross-sectional view illustrating fabrication of a semiconductor device, and showing upper level metallization trench and via opening formation, according to an exemplary embodiment of the present invention.

Referring to FIG. 4, portions of the third dielectric layer 121 (e.g., portions not covered by a mask) are etched down to the etch stop layer 103 to form an upper metallization level trench 124. Since the etch stop layer 103 is not etched by the etchant used to remove the dielectric layer 121 or, at the very least, is etched at a very slow rate with respect to that of the dielectric layer 121, the exposed portion of the dielectric layer 121 can be completely removed to form the trench 124 without etching the areas A1 and A2, such that a via formed below an interconnect formed in trench 124 will have edges E1 and E2 that are not chamfered or have a limited or negligible chamfer. For example, a via opening 128 under the trench 124 is formed in the dielectric layer 111. Due to the coverage provided by the etch stop layer 103, the via opening 128 has an edge E1 adjacent interconnect I2 that is sufficiently spaced apart from interconnect I2 so as to prevent shorting with interconnect I2. A resulting via formed in via opening 128 will be fully-aligned with interconnect I1 and have edges E1 and E2 which are substantially free or free of a chamfer. In other words, with the exception of the portion of the via formed below the stepped portion S (described further herein), a width of a top portion of the resulting via will be the same as or substantially the same as a width of the bottom portion of the resulting via (see, e.g., the via $V_x$ in FIG. 5).

The via opening 128 is formed by removing a portion of the etch stop layer 103 and removing a portion of the dielectric layer 111 and the capping layer 102. The portion of the etch stop layer 103 is removed using, for example, an etch process with $Cl_2/Ar$, and the portion of the capping layer 102 is removed using, for example, an etch process with $CF_4/O_2$. Etching of the dielectric layer 111 is performed using, for example, a process similar to that to remove the dielectric layer 121. The via opening 128 exposes a top surface of the fill layer 105, and top surfaces of the barrier and liner layers 106 and 107. Referring back to FIGS. 2 and 3, the recessing of the interconnect I1 and subsequent filling of the vacant areas 108 with the dielectric layer 111 results in the formation of a stepped portion S upon etching of the dielectric layer 111 and then the capping layer 102. The presence of the stepped portion S of the dielectric layer 101 results in the via $V_x$ being fully aligned with the interconnect I1.

A representative selectivity ratio of the etch rate of the dielectric layers 121 and 111 with respect to that of the etch stop layer 103 would be approximately 5:1. According to an embodiment, the etching of the dielectric layers 121 and 111 is performed using, for example, a fluorocarbon based dry etch process or an ultra-violet (UV) damage and wet etch process.

Figure 5:
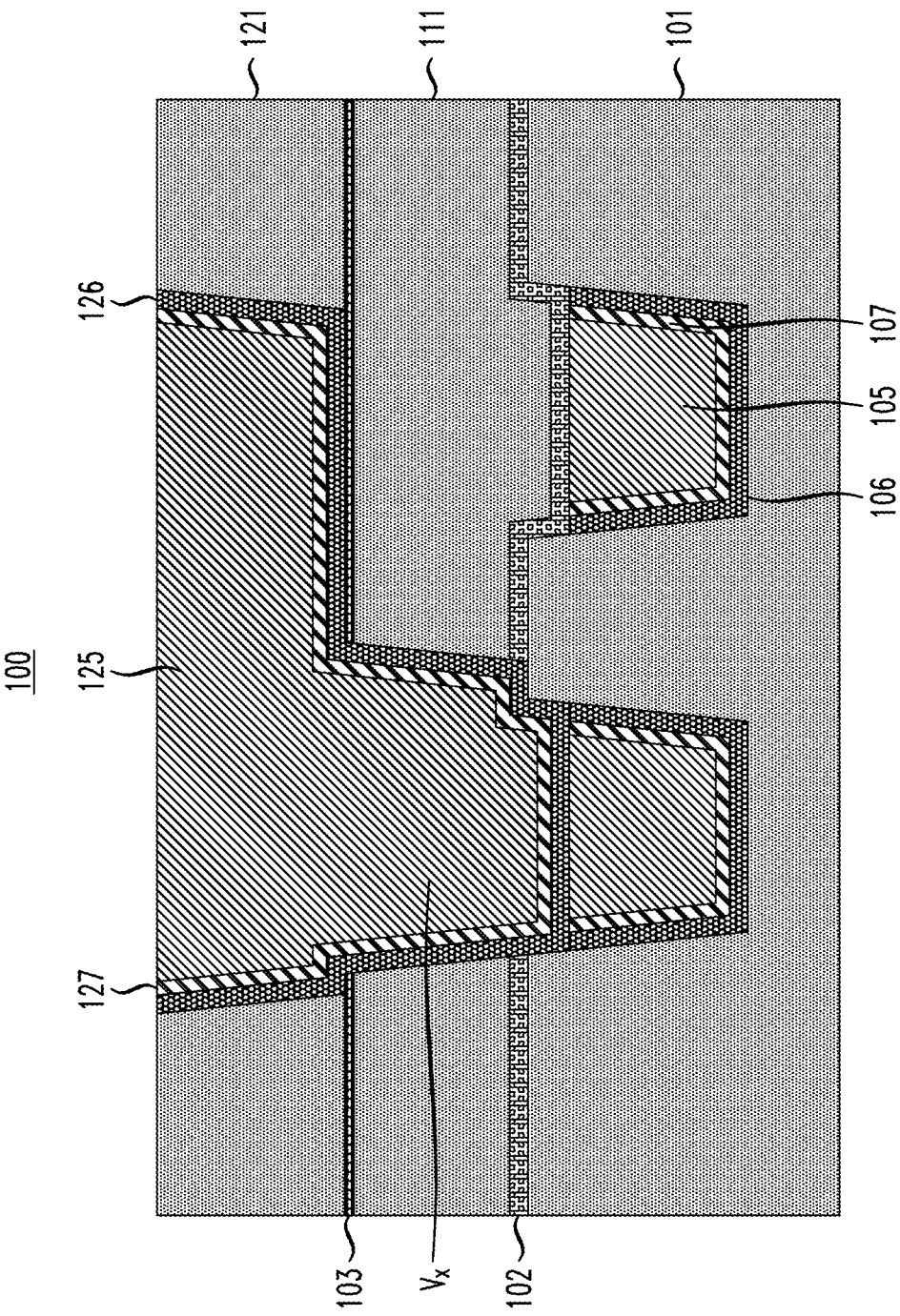
FIG. 5 is a cross-sectional view illustrating fabrication of a semiconductor, and showing formation of barrier, liner and conductive fill layers, according to an exemplary embodiment of the present invention.

Referring to FIG. 5, the trench 124 and opening 128 are lined with barrier and liner layers 126 and 127 the same as or similar to barrier and liner layers 106 and 107, and filled with conductive fill layers 125, similar to fill layer 105. For example, the fill, barrier and liner layers 125, 126 and 127 can have the same material as or similar material to the fill, barrier and liner layers 105, 106 and 107.

The barrier and liner layers 126 and 127 are conformally formed on a top surface of the dielectric layer 121, and on sidewalls and bottom surfaces of the trench 124 and opening 128, including exposed surfaces of the capping layer 102, etch stop layer 103 and dielectric layers 121, 111 and 101, and on the exposed top surfaces of the interconnect I1. The barrier and liner layers 126 and 127 are deposited using, for example, a conformal deposition technique, such as ALD or CVD. The fill layer 125 is deposited on the liner layer 127 using deposition techniques, including, but not necessarily limited to, PVD, CVD, ALD or sputtering.

Following deposition of the fill layer 125, a planarization process, such as, for example, chemical mechanical polishing (CMP), is performed to remove portions of the fill, barrier and liner layers 125, 126 and 127 on the top surface of the dielectric layer 121 and extending out of the trench 124 to planarize an upper surface of the device.

Figure 6:
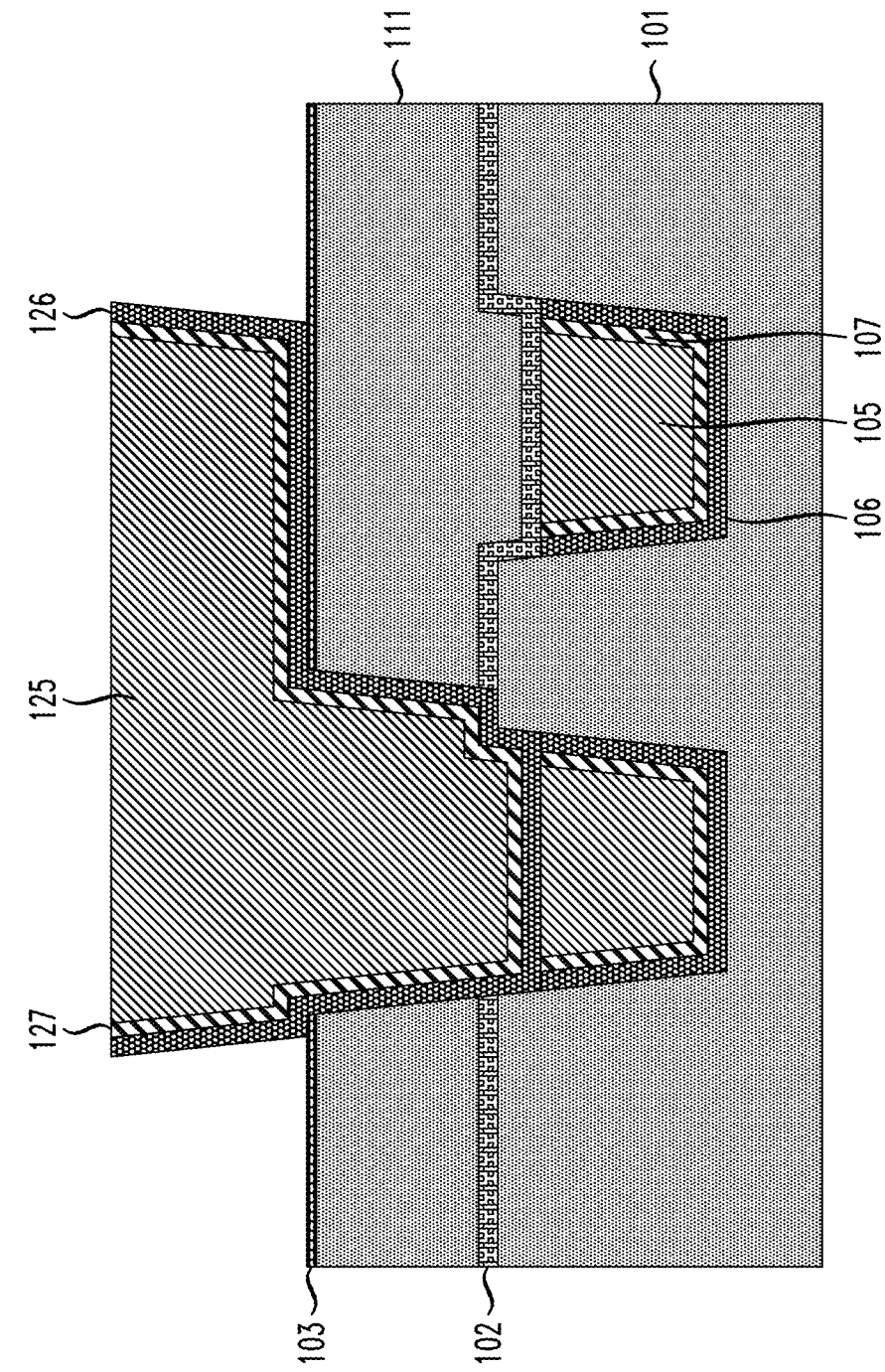
FIG. 6 is a cross-sectional view illustrating fabrication of a semiconductor device, and showing dielectric layer removal, according to an exemplary embodiment of the present invention.
Figure 7:
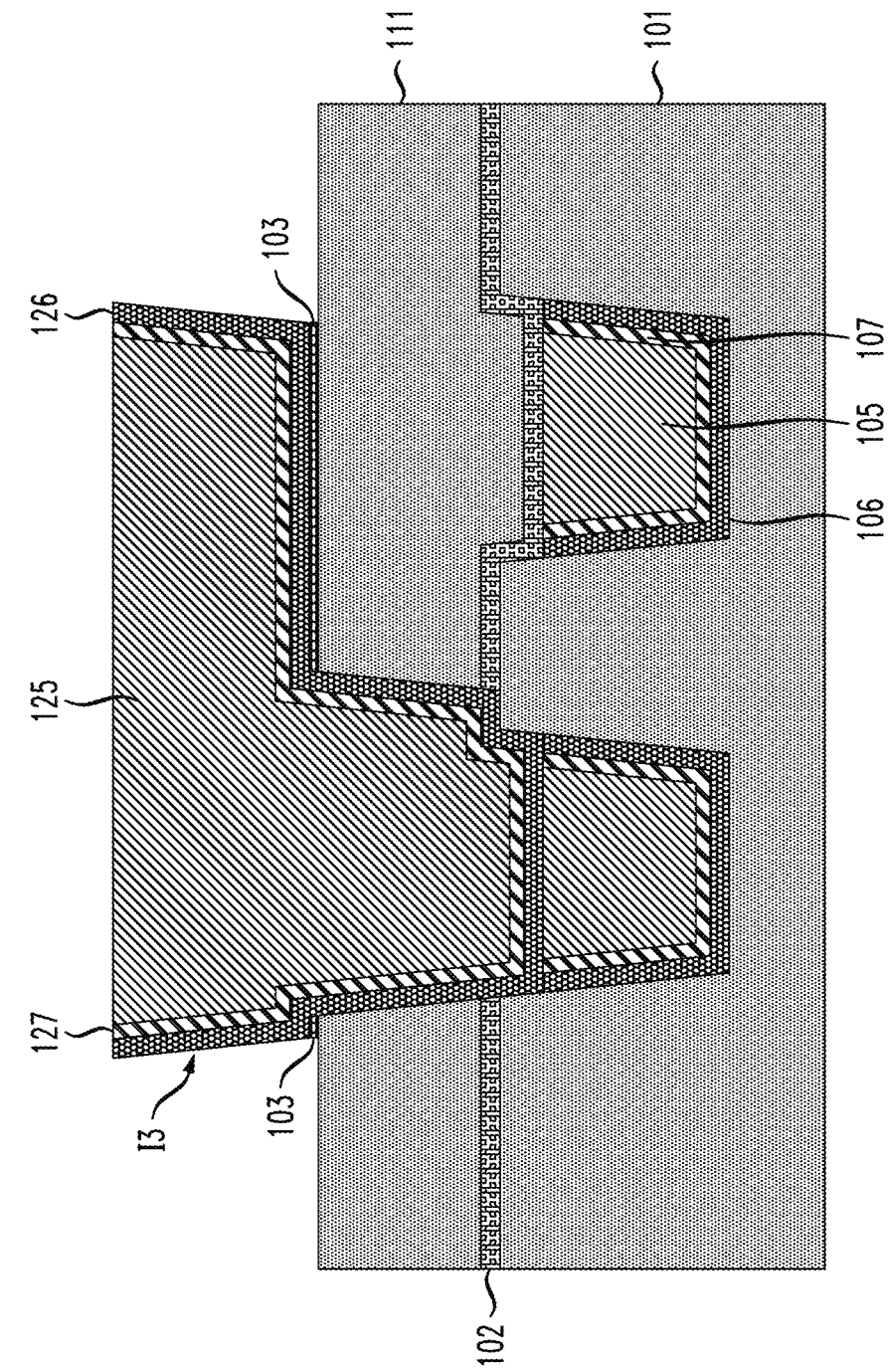
FIG. 7 is a cross-sectional view illustrating fabrication of a semiconductor device, and showing removal of exposed portions of the etch stop layer, according to an exemplary embodiment of the present invention.

Referring to FIG. 6, remaining portions of the dielectric layer 121 are removed using the same or a similar etch process as that described in connection with the removal of portions of the dielectric layer 121 to form the trench 124. The removal of the remaining portions of the dielectric layer 121 exposes portions of the etch stop layer 103 that were under the dielectric layer 121. Referring to FIG. 7, exposed portions of the etch stop layer 103 are removed using, for example, $Cl_2/Ar$. The portions of the etch stop layer 103 under the interconnect structure I3 are not removed. There is no capacitance penalty by removing the exposed portions of the etch stop layer 103.

Figure 8:
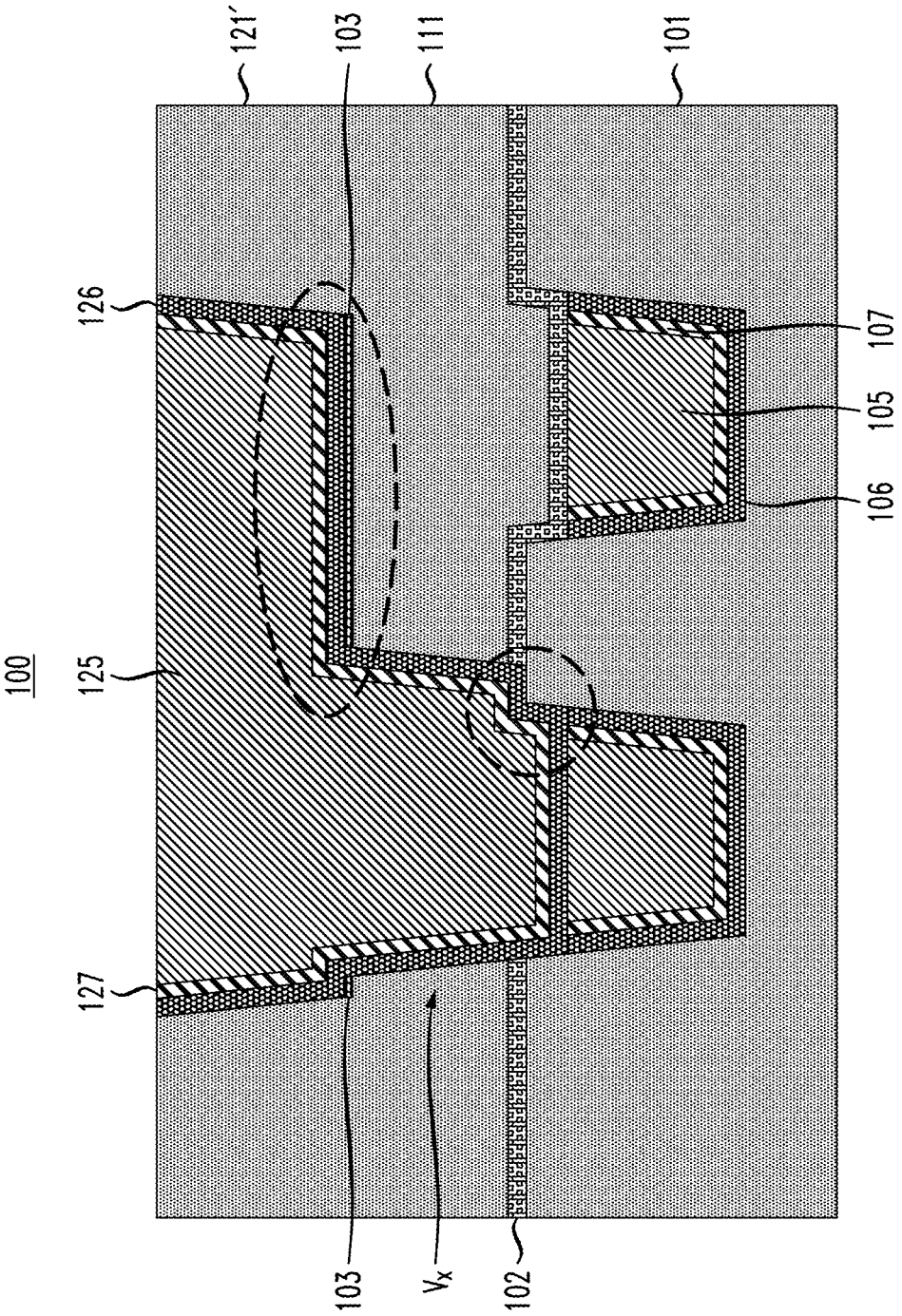
FIG. 8 is a cross-sectional view illustrating fabrication of a semiconductor device, and showing dielectric layer formation and planarization, according to an exemplary embodiment of the present invention.

Referring to FIG. 8, a dielectric layer 121' is formed on the dielectric layer 111 to replace the removed dielectric layer 121 and fills in gaps around the interconnect structure I3 and the remaining portions of the etch stop layer 103. According to an embodiment, the dielectric layer 121' comprises the same or similar material as that of the dielectric layers 101, 111 and 121. The dielectric layer 121' is deposited using, for example, PVD, CVD, ALD, PECVD, RFCVD, MLD, MBD, LSMCD, and/or sputtering, followed by a planarization, such as, for example, CMP to planarize the dielectric layer 121' with the interconnect structure I3.

As shown by the circled portions in FIG. 8, the presence of the etch stop layer 103 permits a via $V_x$ to have edges that are not chamfered or have a limited or negligible chamfer. Due to the coverage provided by the etch stop layer 103, the via $V_x$ has an edge adjacent interconnect I2 that is sufficiently spaced apart from interconnect I2 so as to prevent shorting with interconnect I2. As can be seen in FIG. 8, due to the etch stop layer 103 overlapping the adjacent interconnect I2 and a majority portion of the space between interconnects I1 and I2, the etch stop layer 103 prevents etching of the portions of the dielectric layer 111 thereunder so that at least the right-side edge of the resulting via $V_x$ (edge closest to the interconnect I2) extends vertically or substantially vertically from an end of the horizontal bottom surface of the trench in which the interconnect I3 is formed.

The via $V_x$ is fully-aligned with interconnect I1 and has left and right side edges which are substantially free or free of a chamfer. In other words, with the exception of the portion of the via $V_x$ formed below the stepped portion, a width of a top portion of the via $V_x$ will be the same as or substantially the same as a width of the bottom portion of the via $V_x$. As noted above, the presence of the stepped portion results in the via $V_x$ being fully aligned with the interconnect I1. The interconnect I3 surrounded by the dielectric layer 121' and the dielectric layer 121' can form at least part of an upper metallization level ($M_{x+1}$).

Figure 9:
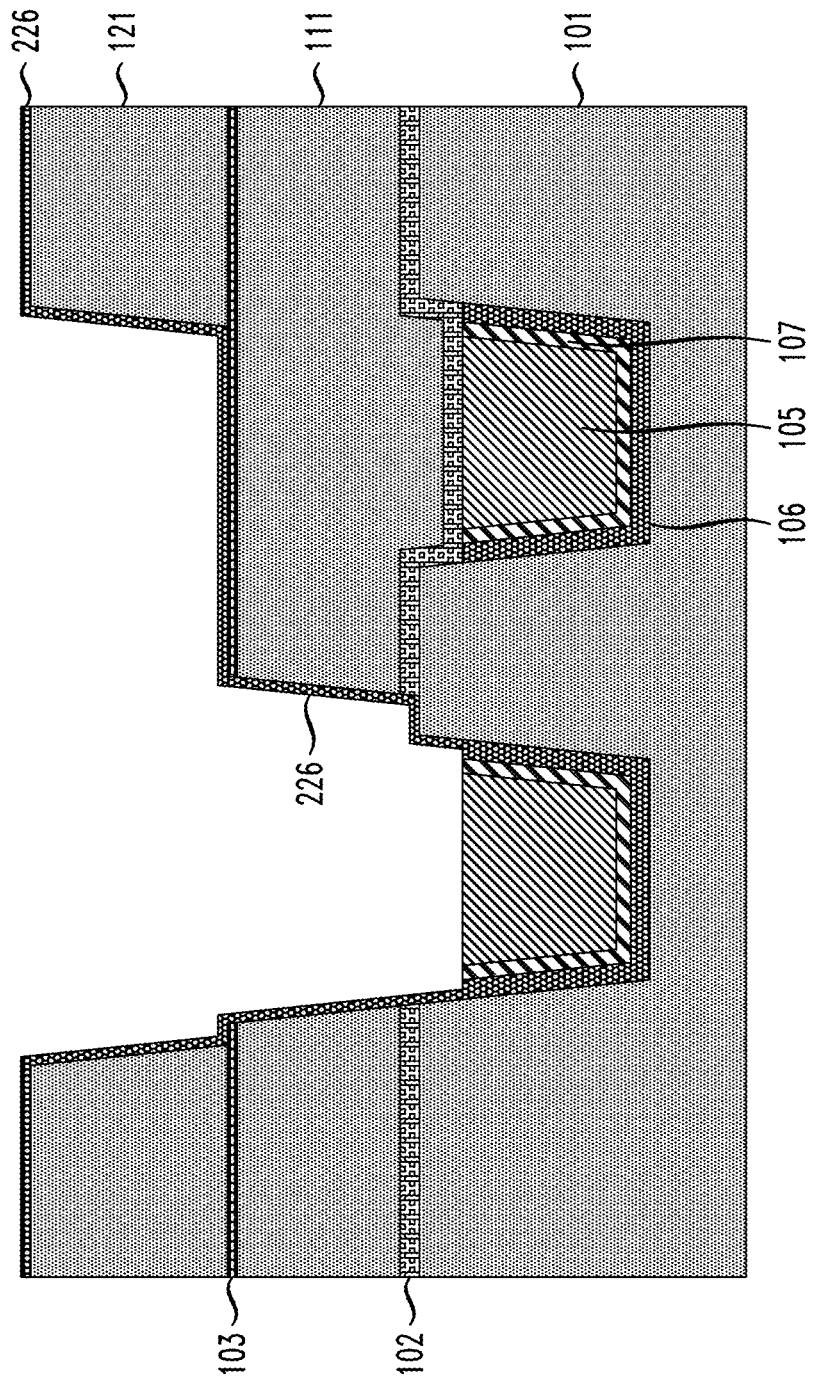
FIG. 9 is a cross-sectional view illustrating fabrication of a semiconductor device, and showing formation of barrier layer, according to an exemplary embodiment of the present invention.

Referring to FIG. 9, following the processing from FIG. 4, in a semiconductor device 200, the trench 124 and opening 128 are lined with a barrier layer 226 thinner than the barrier layer 126 discussed herein above such that the barrier layer 226 is not formed on the top surface of the interconnect I1. For example, a thickness of the barrier layer 226 is in the range of about 0.5 nm-about 1 nm, while a thickness of the barrier layer 126 discussed in connection with FIG. 5 can be in the range of about 0.5 nm-5 nm. The barrier layer 226 can have the same material as or similar material to the barrier layer 126, and can be deposited using, for example, a conformal deposition technique, such as ALD or CVD. In an example embodiment, the barrier layer 226 comprises ALD TaN. For example, in the case of thin ALD TaN deposition (less than 1 nm thick), ALD TaN grows only on dielectric surfaces and will not be present on the surface of the interconnect I1 comprising metal materials. FIG. 9 shows the barrier layer 226 on the etch stop layer 103. In this case, the etch stop layer 103 is a dielectric material. Alternatively, the etch stop layer 103 can be a metal material, where no barrier layer 226 would be formed on the etch stop layer 103. FIG. 9 further shows the barrier layer 226 on surfaces of the dielectric layers 121, 111 and 101 and of the capping layer 102. No barrier layer 226 is shown on the interconnect I1. The lack of a barrier layer 226 on the interconnect I1 lowers resistance of the resulting via $V2_x$ (see FIG. 11) and improves device performance.

Figure 10:
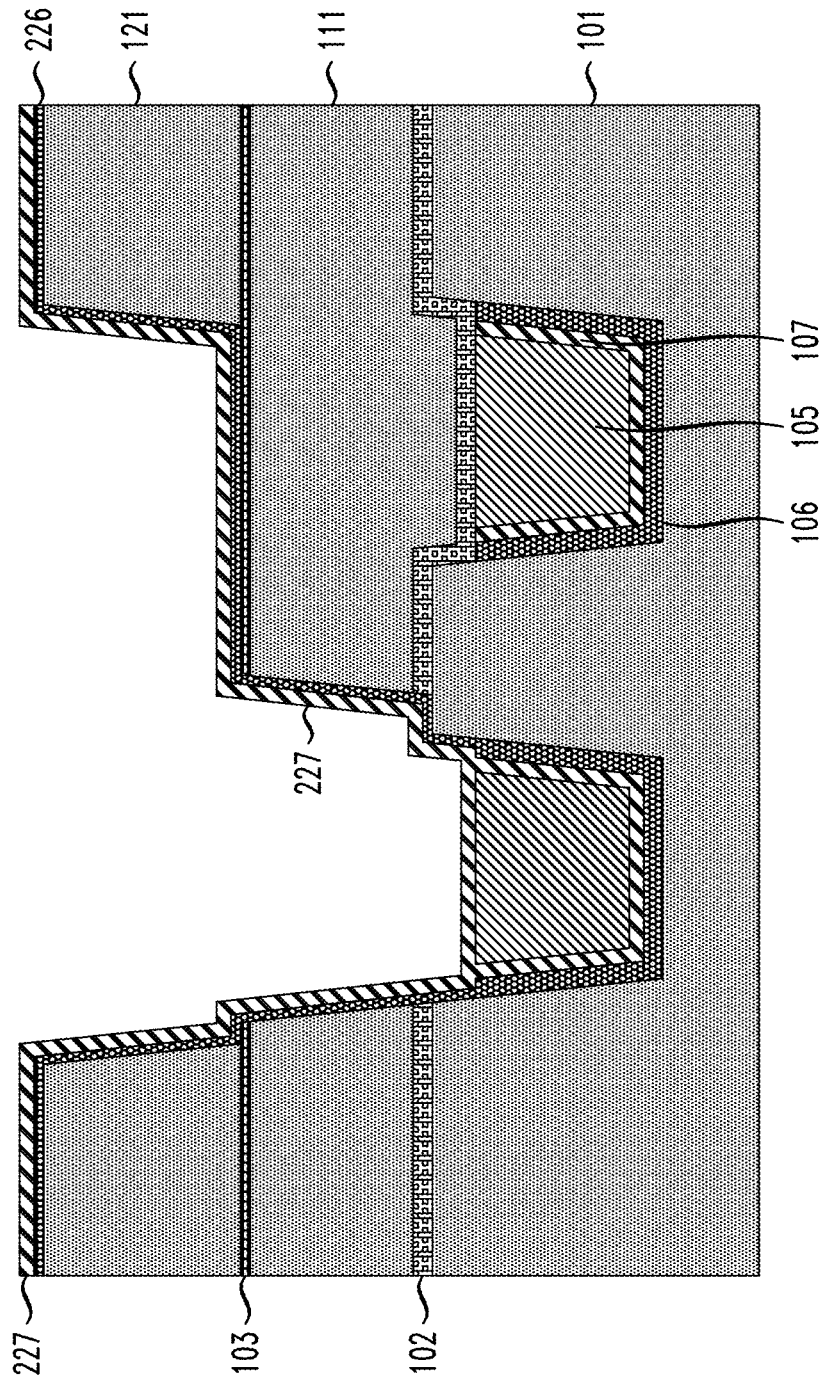
FIG. 10 is a cross-sectional view illustrating fabrication of a semiconductor device, and showing formation of liner layer, according to an exemplary embodiment of the present invention.

Referring to FIG. 10, a liner layer 227 is deposited on the barrier layer 226, and on the top surface of the interconnect I1. The liner layer 227 can have the same material as or similar material to the liner layer 127, and can be deposited using, for example, a conformal deposition technique, such as ALD or CVD.

Figure 11:
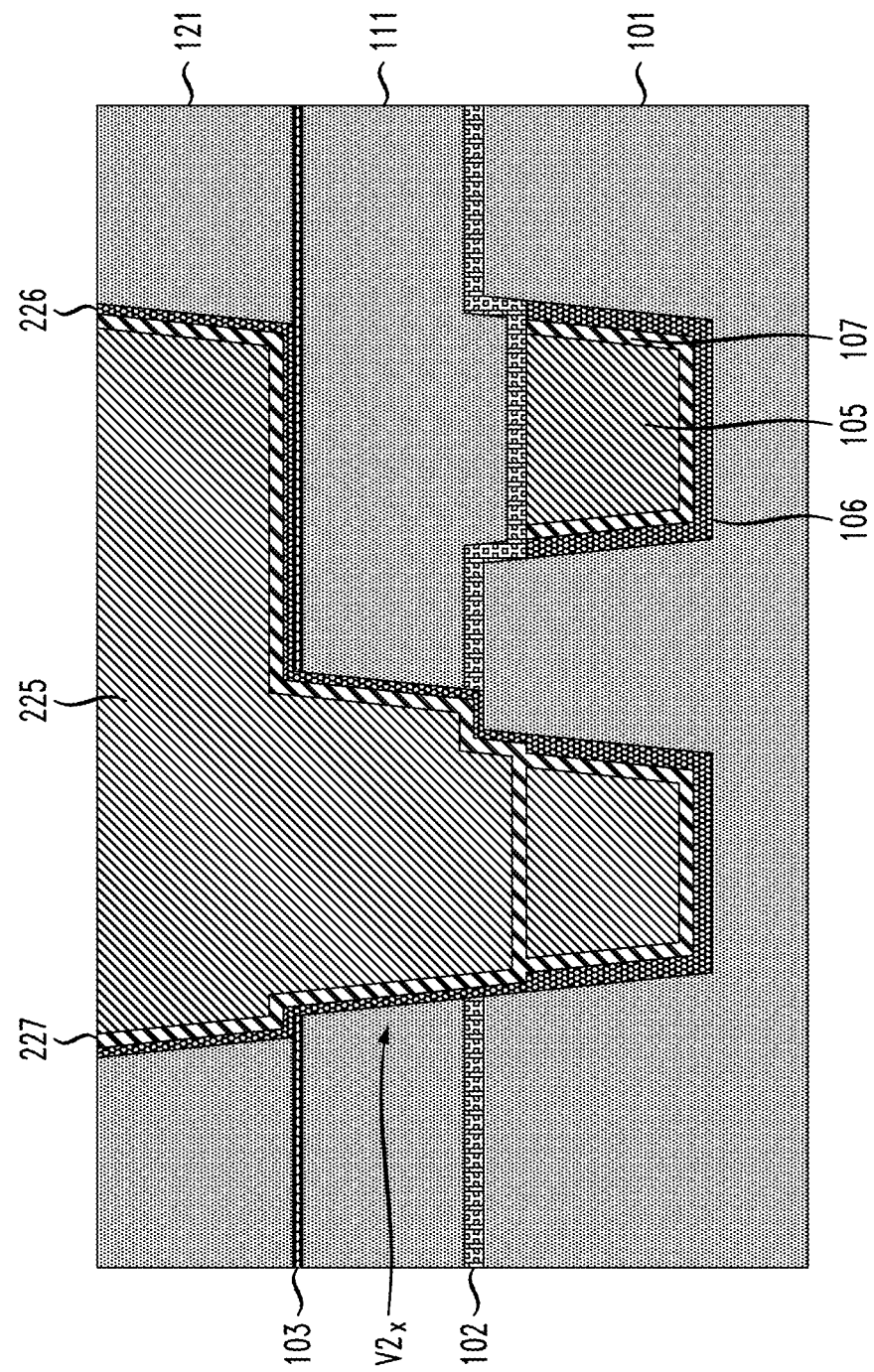
FIG. 11 is a cross-sectional view illustrating fabrication of a semiconductor, and showing formation of a conductive fill layer, according to an exemplary embodiment of the present invention.

Referring to FIG. 11, the remaining portions of the trench 124 and opening 128 are filled with conductive fill layer 225, similar to fill layer 125. For example, the fill layer 225 can have the same material as or similar material to the fill layer 125. The fill layer 225 is deposited on the liner layer 227 using deposition techniques, including, but not necessarily limited to, PVD, CVD, ALD or sputtering.

Following deposition of the fill layer 225, a planarization process, such as, for example, CMP, is performed to remove portions of the fill, barrier and liner layers 225, 226 and 227 on the top surface of the dielectric layer 121 and extending out of the trench 124 to planarize an upper surface of the device.

Figure 12:
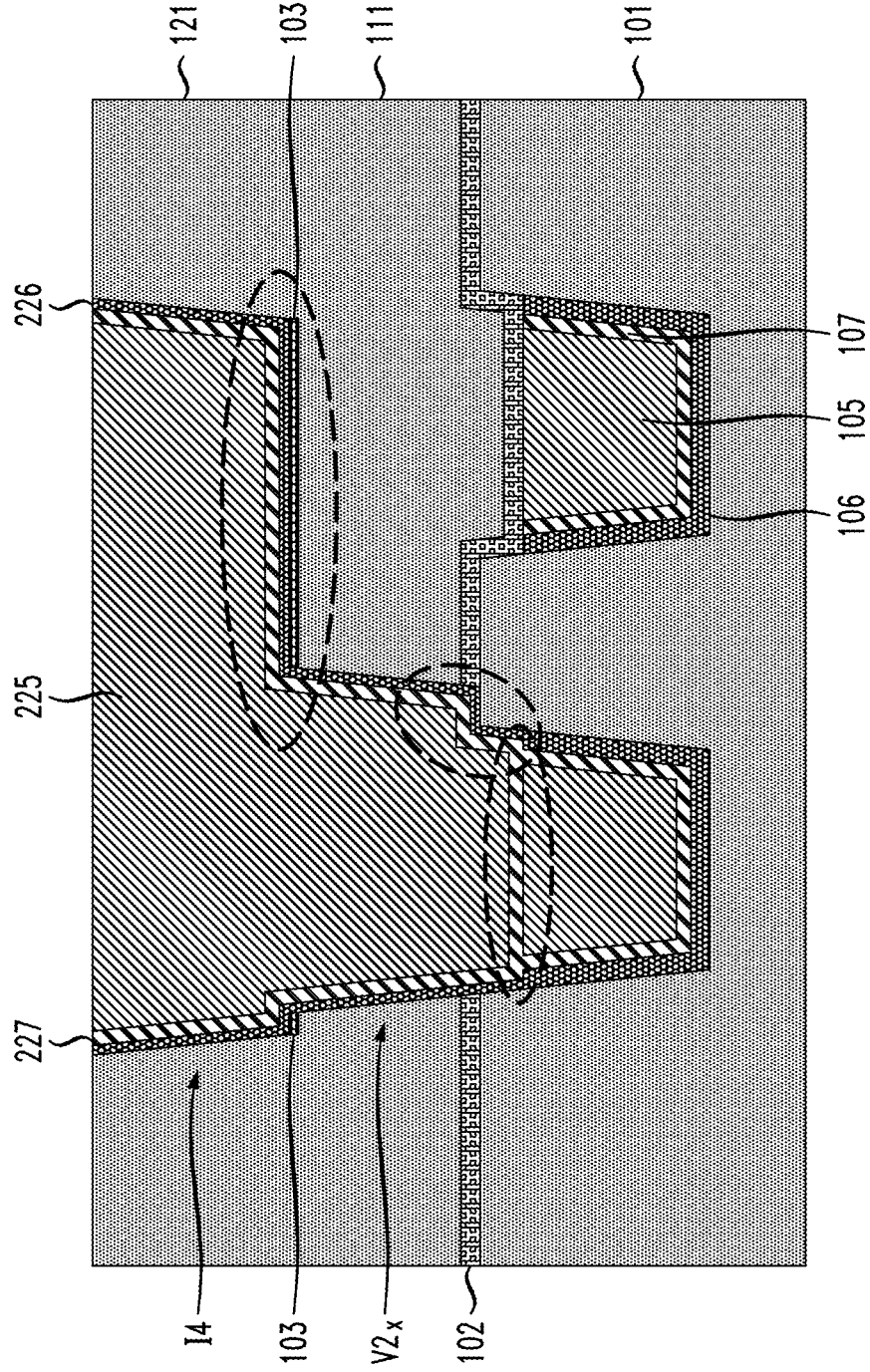
FIG. 12 is a cross-sectional view illustrating fabrication of a semiconductor device, and showing removal of exposed portions of the etch stop layer and replacement dielectric layer formation and planarization, according to an exemplary embodiment of the present invention.

Referring to FIG. 12, following the same or similar processing to that described in connection with FIGS. 6, 7 and 8, remaining portions of the dielectric layer 121 are removed, which exposes portions of the etch stop layer 103 that were under the dielectric layer 121. The exposed portions of the etch stop layer 103 are removed. The portions of the etch stop layer 103 under the interconnect structure I4 are not removed. There is no capacitance penalty by removing the exposed portions of the etch stop layer 103.

A dielectric layer 221 is formed on the dielectric layer 111 to replace the removed dielectric layer 121 and fills in gaps around the interconnect structure I4 and the remaining portions of the etch stop layer 103. According to an embodiment, the dielectric layer 221 comprises the same or similar material as that of the dielectric layers 101, 111 and 121. The dielectric layer 221 is deposited using, for example, PVD, CVD, ALD, PECVD, RFCVD, MLD, MBD, LSMCD, and/or sputtering, followed by a planarization, such as, for example, CMP to planarize the dielectric layer 221 with the interconnect structure I4.

As shown by the circled portions in FIG. 12, the presence of the etch stop layer 103 permits the via $V2_x$ to have edges that are not chamfered or have a limited or negligible chamfer. Due to the coverage provided by the etch stop layer 103, the via $V2_x$ has an edge adjacent interconnect I2 that is sufficiently spaced apart from interconnect I2 so as to prevent shorting with interconnect I2. As can be seen in FIG. 12, due to the etch stop layer 103 overlapping the adjacent interconnect I2 and a majority portion of the space between interconnects I1 and I2, the etch stop layer 103 prevents etching of the portions of the dielectric layer 111 thereunder so that at least the right-side edge of the resulting via $V2_x$ (edge closest to the interconnect I2) extends vertically or substantially vertically from an end of the horizontal bottom surface of the trench in which the interconnect I4 is formed.

The via $V2_x$ is fully-aligned with interconnect I1 and has left and right side edges which are substantially free or free of a chamfer. In other words, with the exception of the portion of the via $V2_x$ formed after the stepped portion, a width of a top portion of the via $V2_x$ will be the same as or substantially the same as a width of the bottom portion of the via $V2_x$. As noted above, the presence of the stepped portion results in the via $V2_x$ being fully aligned with the interconnect I1. The interconnect I4 surrounded by the dielectric layer 221 and the dielectric layer 221 can form at least part of an upper metallization level ($M_{x+1}$).

In addition, the lowermost circled portion in FIG. 12 illustrates the lack of a barrier layer 226 at the bottom of the via $V2_x$, where the fill layer 225 is deposited directly on the liner layer 227.

Figure 13:
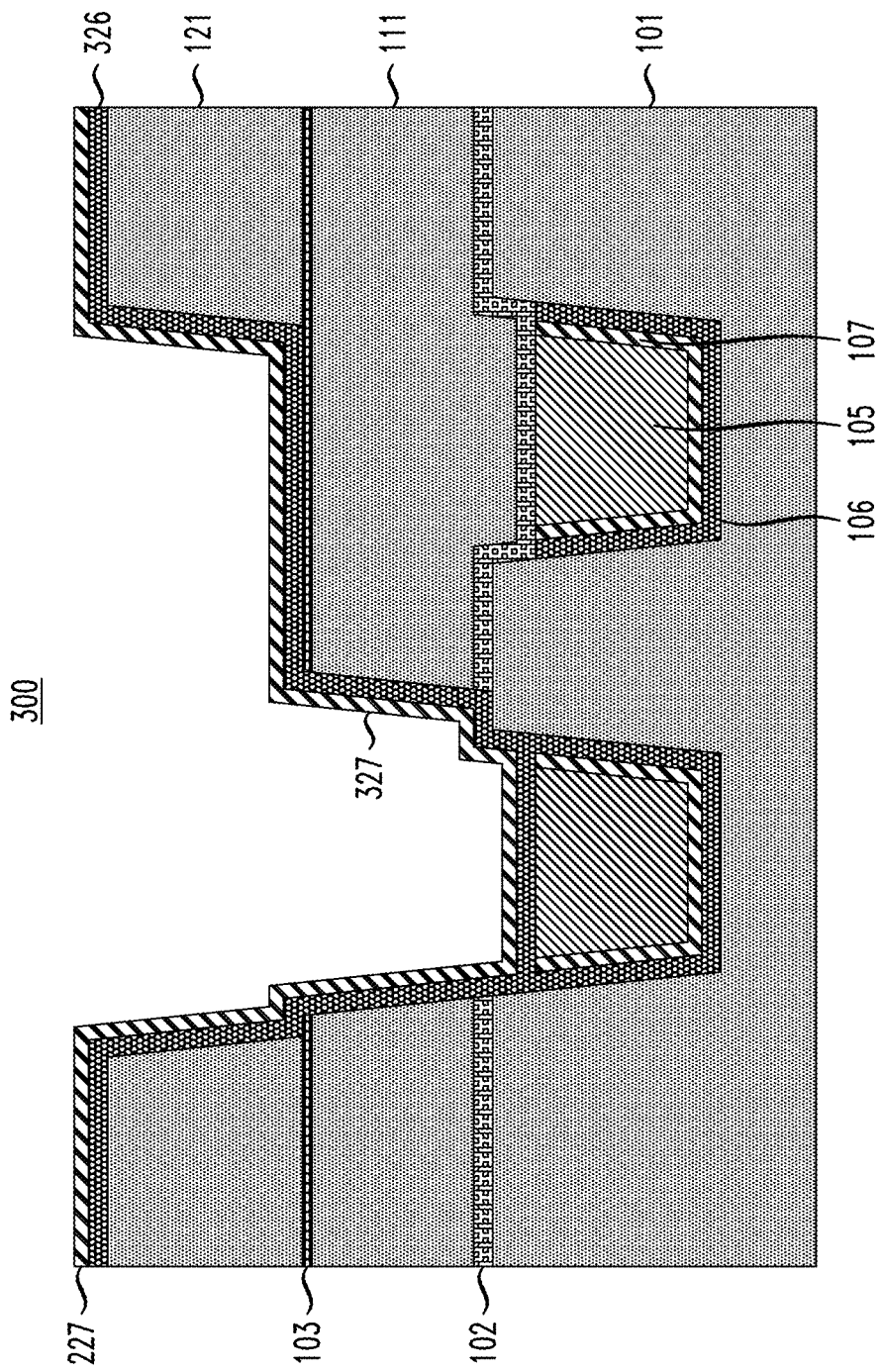
FIG. 13 is a cross-sectional view illustrating fabrication of a semiconductor device, and showing formation of barrier and liner layer, according to an exemplary embodiment of the present invention.

Referring to FIG. 13, following the processing from FIG. 4, in a semiconductor device 300, the trench 124 and opening 128 are lined with barrier and liner layers 326 and 327 the same as or similar to barrier and liner layers 106 and 107. For example, the barrier and liner layers 326 and 327 can have the same material as or similar material to the barrier and liner layers 106 and 107.

The barrier and liner layers 326 and 327 are conformally formed on a top surface of the dielectric layer 121, and on sidewalls and bottom surfaces of the trench 124 and opening 128, including exposed surfaces of the capping layer 102, etch stop layer 103 and dielectric layers 121, 111 and 101, and on the exposed top surfaces of the interconnect I1. The barrier and liner layers 326 and 327 are deposited using, for example, a conformal deposition technique, such as ALD or CVD.

Figure 14:
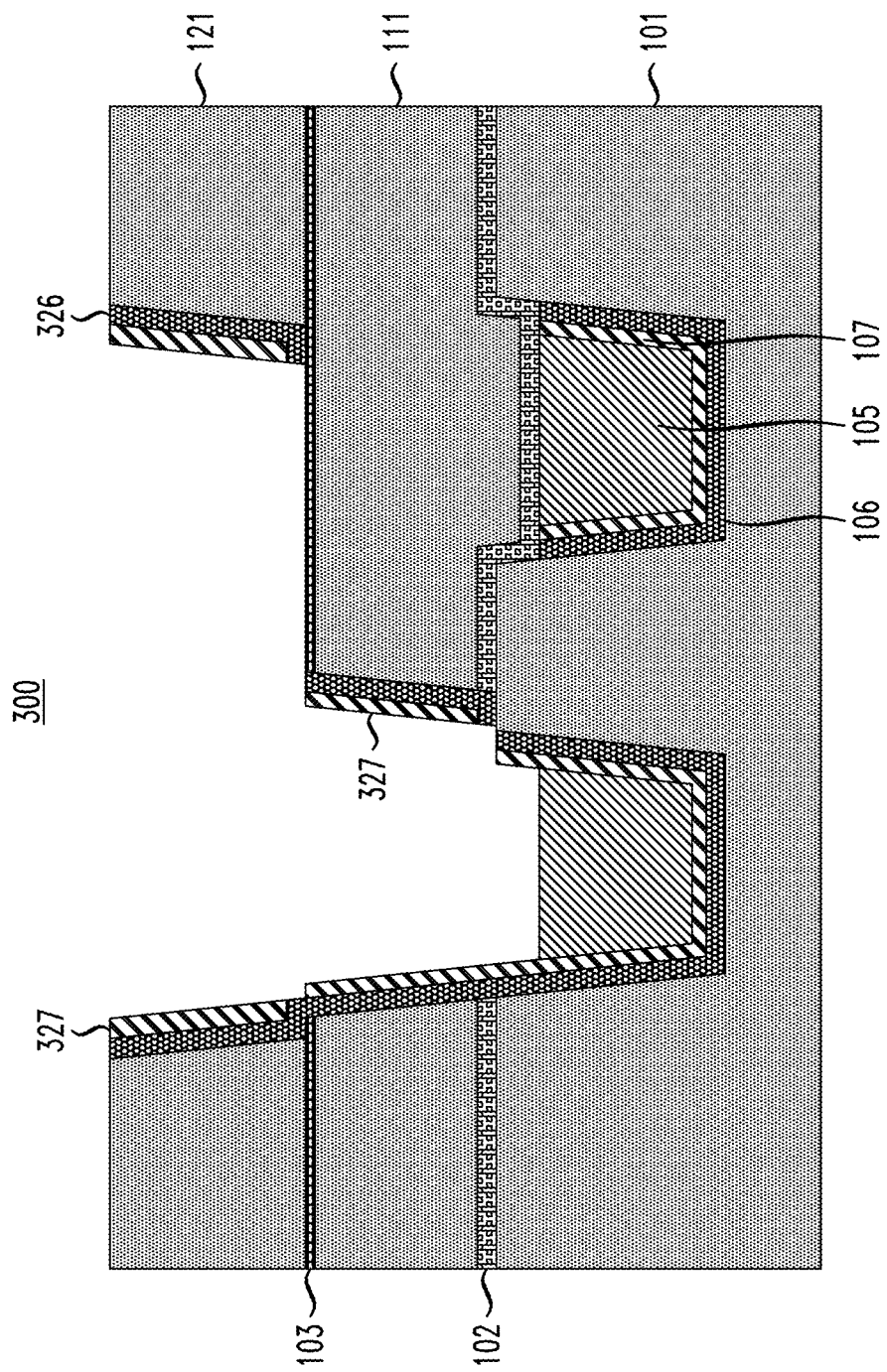
FIG. 14 is a cross-sectional view illustrating fabrication of a semiconductor device, and showing barrier and liner layer etch back, according to an exemplary embodiment of the present invention.

Referring to FIG. 14, horizontal portions of the barrier and liner layers 326 and 327 are removed in an etch back process. The etch back process can be performed using, for example, a directional dry etch process comprising $Cl_2/Ar$. The etch back process removes portions of the barrier and liner layers 326 and 327 from top surfaces of the dielectric layers 121 and 111, the top surface of the etch stop layer 103 and the top surface of the interconnect I1, including the fill layer 105.

Figure 15:
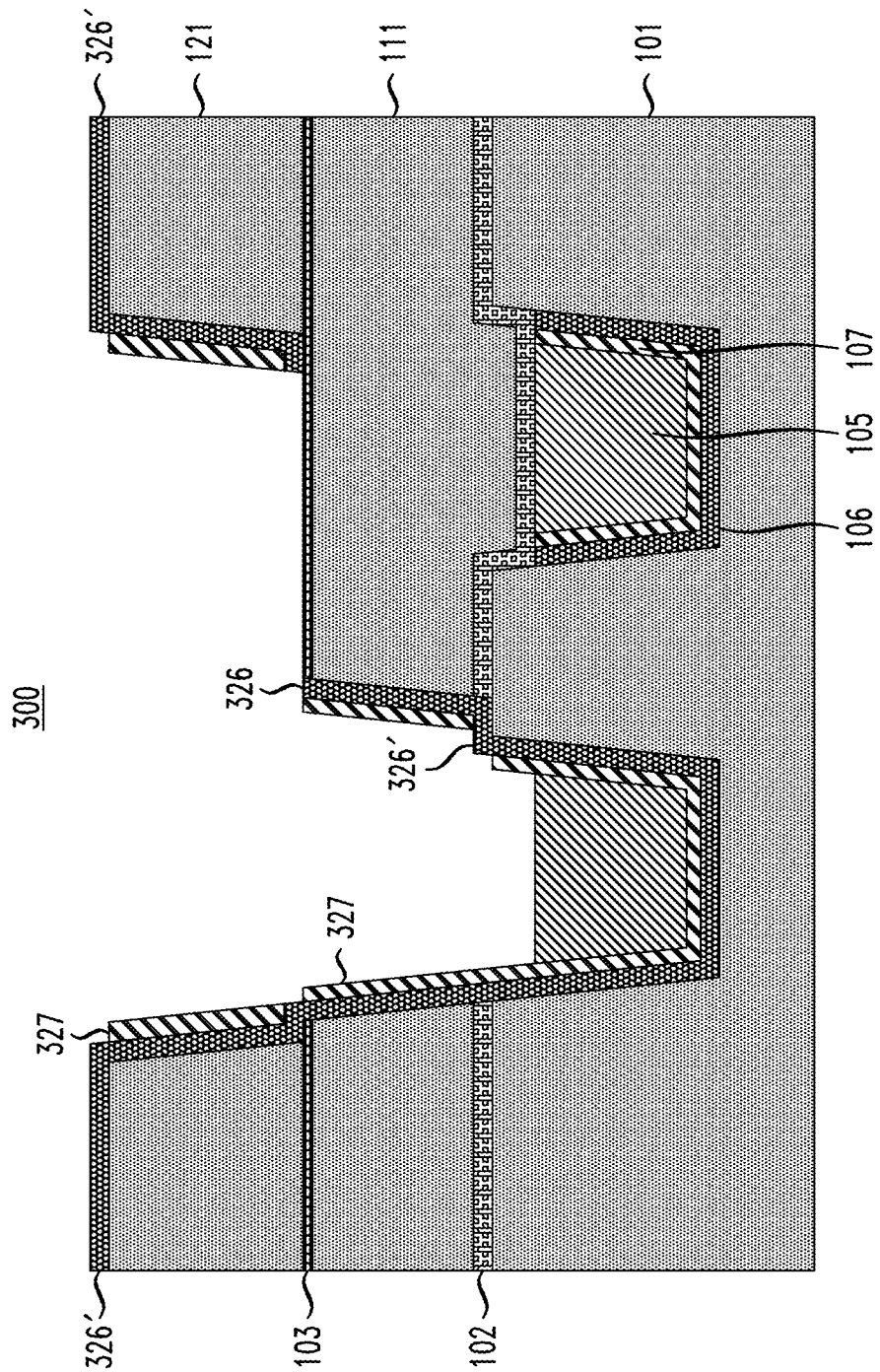
FIG. 15 is a cross-sectional view illustrating fabrication of a semiconductor device, and showing selective barrier layer deposition, according to an exemplary embodiment of the present invention.

Referring to FIG. 15, a second barrier layer 326' is selectively deposited on exposed surfaces of the dielectric layers 121 and 101, but not on other surfaces. In this embodiment, the etch stop layer 103 comprises a metal material. As noted above in connection with FIG. 9, in the case of a thin barrier layer 326', such as for example, ALD TaN having a thickness less than 1 nm, the barrier layer 326' grows only on dielectric surfaces and will not be present on the surfaces of the interconnect I1, the etch stop layer 103, the first barrier layer 326 and the liner layer 327 comprising metal materials. FIG. 15 shows the deposition of the barrier layer 326' limited to the surfaces of the dielectric layers 121 and 101.

Figure 16:
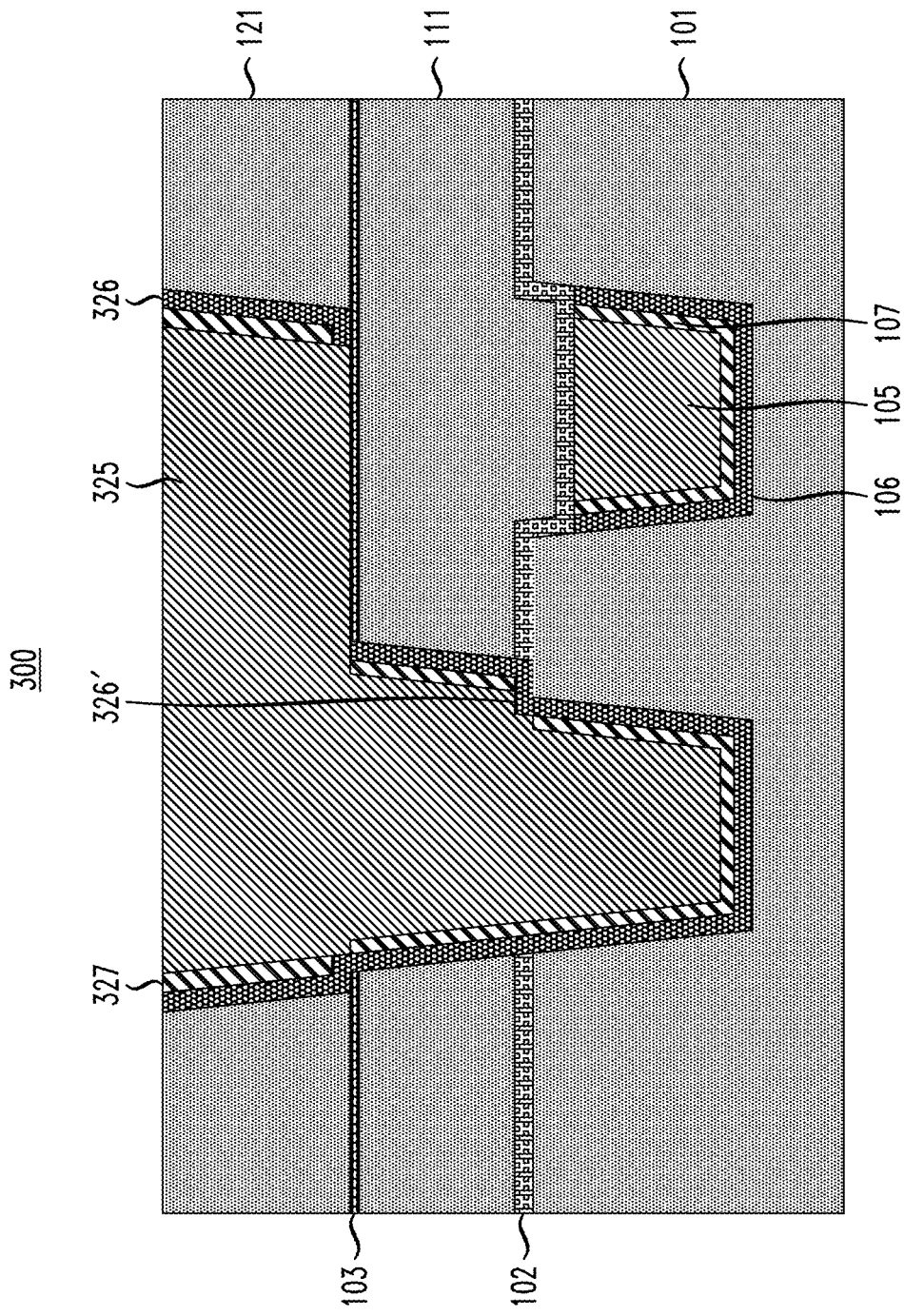
FIG. 16 is a cross-sectional view illustrating fabrication of a semiconductor, and showing formation of a conductive fill layer, according to an exemplary embodiment of the present invention.

Referring to FIG. 16, the remaining portions of the trench 124 and opening 128 are filled with conductive fill layer 325, similar to fill layers 125 and 225. For example, the fill layer 325 can have the same material as or similar material to the fill layers 125 and 225. The fill layer 325 is deposited on the exposed portions of the first barrier, liner, second barrier layers 326, 327 and 326', as well as on the exposed portions of the etch stop layer 103 and the interconnect I1, including fill layer 105. The fill layer 325 is deposited using deposition techniques, including, but not necessarily limited to, PVD, CVD, ALD or sputtering.

Following deposition of the fill layer 325, a planarization process, such as, for example, CMP, is performed to remove portions of the fill and second barrier layers 325 and 326' on the top surface of the dielectric layer 121 and extending out of the trench 124 to planarize an upper surface of the device.

Figure 17:
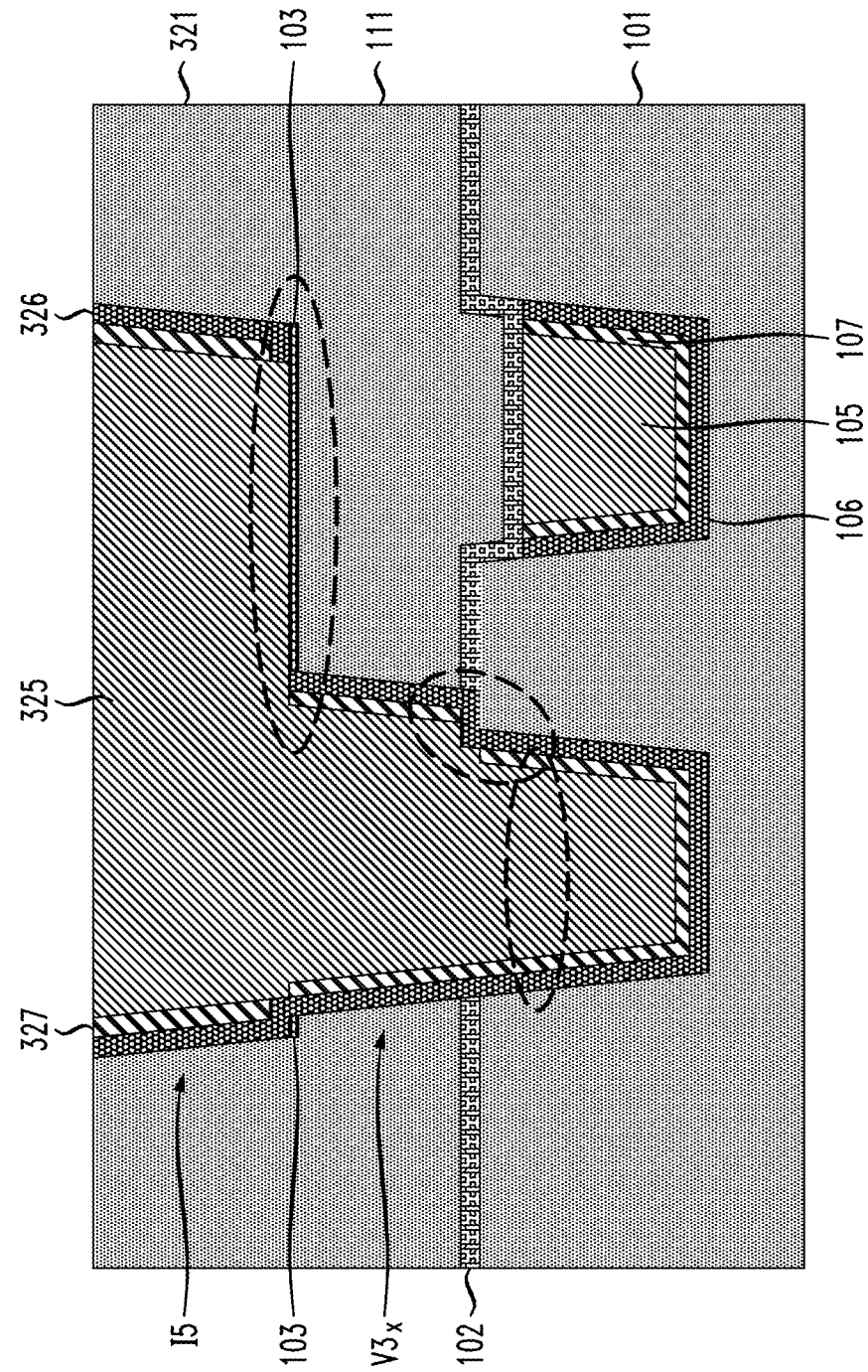
FIG. 17 is a cross-sectional view illustrating fabrication of a semiconductor device, and showing removal of exposed portions of the etch stop layer and replacement dielectric layer formation and planarization, according to an exemplary embodiment of the present invention.

Referring to FIG. 17, following the same or similar processing to that described in connection with FIGS. 6, 7, 8 and 12, remaining portions of the dielectric layer 121 are removed, which exposes portions of the etch stop layer 103 that were under the dielectric layer 121. The exposed portions of the etch stop layer 103 are removed. The portions of the etch stop layer 103 under the interconnect structure I5 are not removed. There is no capacitance penalty by removing the exposed portions of the etch stop layer 103.

A dielectric layer 321 is formed on the dielectric layer 111 to replace the removed dielectric layer 121 and fills in gaps around the interconnect structure I5 and the remaining portions of the etch stop layer 103. According to an embodiment, the dielectric layer 321 comprises the same or similar material as that of the dielectric layers 101, 111 and 121. The dielectric layer 321 is deposited using, for example, PVD, CVD, ALD, PECVD, RFCVD, MLD, MBD, LSMCD, and/or sputtering, followed by a planarization, such as, for example, CMP to planarize the dielectric layer 321 with the interconnect structure I5.

As shown by the circled portions in FIG. 17, the presence of the etch stop layer 103 permits the via $V3_x$ to have edges that are not chamfered or have a limited or negligible chamfer. Due to the coverage provided by the etch stop layer 103, the via $V3_x$ has an edge adjacent interconnect I2 that is sufficiently spaced apart from interconnect I2 so as to prevent shorting with interconnect I2. As can be seen in FIG. 17, due to the etch stop layer 103 overlapping the adjacent interconnect I2 and a majority portion of the space between interconnects I1 and I2, the etch stop layer 103 prevents etching of the portions of the dielectric layer 111 thereunder so that at least the right-side edge of the resulting via $V3_x$ (edge closest to the interconnect I2) extends vertically or substantially vertically from an end of the horizontal bottom surface of the trench in which the interconnect I5 is formed.

The via $V3_x$ is fully-aligned with interconnect I1 and has left and right side edges which are substantially free or free of a chamfer. In other words, with the exception of the portion of the via $V3_x$ formed below the stepped portion, a width of a top portion of the via $V3_x$ will be the same as or substantially the same as a width of the bottom portion of the via $V3_x$. As noted above, the presence of the stepped portion results in the via $V3_x$ being fully aligned with the interconnect I1. The interconnect I5 surrounded by the dielectric layer 321 and the dielectric layer 321 can form at least part of an upper metallization level ($M_{x+1}$).

In addition, the lowermost circled portion in FIG. 17 illustrates the lack of a barrier layer and a liner layer at the bottom of the via $V3_x$, where the fill layer 325 is deposited directly on the interconnect structure I1. The removal of the liner and barrier layers at the bottom of the via $V3_x$ lowers the resistance as compared to when the liner and barrier layers are present, thereby improving device performance.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a first interconnect in a first dielectric layer;
    forming a second dielectric layer on the first dielectric layer;
    forming an etch stop layer on the second dielectric layer;
    forming a third dielectric layer on the etch stop layer;
    forming a trench in the third dielectric layer, wherein a bottom surface of the trench comprises the etch stop layer;
    forming a second interconnect in the trench on the etch stop layer; and
    forming a via in the second dielectric layer comprising:
        forming an opening in the second dielectric layer;
        depositing at least a barrier layer on at least sides of the second dielectric layer defining the opening;
        exposing the first interconnect through the opening; and
        depositing a conductive fill layer in the opening;
    wherein the via connects the second interconnect to the first interconnect.

2. The method according to claim 1, wherein an edge of the via extends from the bottom surface of the trench comprising the etch stop layer.

3. The method according to claim 2, wherein the edge of the via is vertical or substantially vertical with respect to the bottom surface of the trench.

4. The method according to claim 1, further comprising recessing the first interconnect with respect to a top surface of the first dielectric layer to form a recessed first interconnect.

5. The method according to claim 4, further comprising forming a capping layer on the recessed first interconnect.

6. The method according to claim 5, wherein the second dielectric layer is formed on the capping layer.

7. The method according to claim 4, wherein forming the opening in the second dielectric layer comprises exposing a top surface of the recessed first interconnect.

8. The method according to claim 7, wherein forming the via in the second dielectric layer further comprises depositing the barrier layer and a liner layer on the sides of the second dielectric layer defining the opening, and on the top surface of the recessed first interconnect.

9. The method according to claim 8, wherein forming the via in the second dielectric layer further comprises:
    removing the barrier layer and the liner layer from the top surface of the recessed first interconnect; and
    depositing the conductive fill layer in the opening and on the top surface of the recessed first interconnect.

10. The method according to claim 7, wherein forming the via in the second dielectric layer further comprises selectively depositing the barrier layer on the sides of the second dielectric layer defining the opening, and leaving the top surface of the recessed first interconnect exposed.

11. The method according to claim 10, wherein forming the via in the second dielectric layer further comprises:
    depositing a liner layer on the barrier layer and on the top surface of the recessed first interconnect; and
    depositing a conductive fill layer on the liner layer.

12. The method according to claim 1, wherein the etch stop layer comprises a conductive material.

13. The method according to claim 12, wherein the etch stop layer comprises one of tantalum (Ta), tantalum nitride (TaN), Ta/TaN, Ta/Ruthenium (Ru), Ta/Cobalt (Co), TaN/Ru, TaN/Co, Ta/TaN/Ru, and Ta/TaN/Co.

14. The method according to claim 1, wherein forming the via in the second dielectric layer further comprises:
    depositing the barrier layer and a liner layer on the sides of the second dielectric layer defining the opening, and on the first interconnect;
    removing the barrier layer and the liner layer from a top surface of the first interconnect; and
    depositing the conductive fill layer in the opening and on the top surface of the recessed first interconnect.

15. A semiconductor device, comprising:
    a first interconnect disposed in a first dielectric layer;
    a second dielectric layer disposed on the first dielectric layer;
    a third dielectric layer disposed on the second dielectric layer;
    a second interconnect disposed in a trench in the third dielectric layer; and
    a via disposed in the second dielectric layer, wherein the via connects the second interconnect to the first interconnect, and further wherein the via comprises a stepped portion.

16. The semiconductor device according to claim 15, wherein a top surface of the first interconnect is recessed with respect to a top surface of the first dielectric layer.

17. The semiconductor device according to claim 15, wherein a bottom surface of the trench comprises an etch stop layer, and wherein the etch stop layer is disposed on the second dielectric layer.

18. The semiconductor device according to claim 17, wherein an edge of the via extends from the bottom surface of the trench comprising the etch stop layer.

19. The semiconductor device according to claim 18, wherein the edge of the via is vertical or substantially vertical with respect to the bottom surface of the trench.

20. A semiconductor device, comprising:
    a first interconnect in a first dielectric layer;
    a second interconnect in at least a second dielectric layer disposed on the first dielectric layer, at least a portion of the second interconnect being disposed on an etch stop layer, the etch stop layer comprising a conductive material; and
    a via connecting the second interconnect to the first interconnect.

* * * * *